United States Patent
Yamazaki et al.

(10) Patent No.: US 7,355,938 B2
(45) Date of Patent: Apr. 8, 2008

(54) TIMING RECOVERY METHOD AND STORAGE APPARATUS FOR SUPPRESSING CONTROL OF SAMPLING POSITIONS

(75) Inventors: Akihiro Yamazaki, Kawasaki (JP); Takao Sugawara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1132 days.

(21) Appl. No.: 10/359,999

(22) Filed: Feb. 6, 2003

(65) Prior Publication Data

US 2004/0030948 A1 Feb. 12, 2004

(30) Foreign Application Priority Data

Aug. 7, 2002 (JP) ............... 2002-229393

(51) Int. Cl.
*G11B 7/00* (2006.01)
(52) U.S. Cl. ............... 369/47.28; 369/59.21; 369/59.22
(58) Field of Classification Search ............ 369/47.28, 369/59.21, 59.22; 714/39; 375/355, 229, 375/371–376
See application file for complete search history.

(56) References Cited

U.S. PATENT DOCUMENTS

| 5,719,843 A | 2/1998 | Nakajima et al. |
| 5,968,201 A | 10/1999 | Shida et al. |
| 6,002,730 A * | 12/1999 | Kim et al. .................. 375/371 |
| 6,600,617 B1* | 7/2003 | Zeng ........................... 360/68 |
| 6,977,879 B1* | 12/2005 | Hamada et al. ......... 369/53.34 |
| 7,136,440 B2* | 11/2006 | Brianti et al. ............... 375/355 |
| 2002/0116667 A1* | 8/2002 | McEwen et al. .............. 714/39 |

FOREIGN PATENT DOCUMENTS

| JP | 07-123358 | 5/1995 |
| JP | 9-7313 | 1/1997 |
| JP | 9-288871 | 11/1997 |
| JP | 11-330985 | 11/1999 |
| JP | 2001-035095 | 2/2001 |

* cited by examiner

*Primary Examiner*—Wayne Young
*Assistant Examiner*—La Tanya Bibbins
(74) *Attorney, Agent, or Firm*—Greer, Burns & Crain, Ltd.

(57) ABSTRACT

A timing recovery method samples, equalizes and detects a signal reproduced from a recording medium and to output a detection signal, controls sampling positions based on a phase error between the equalized signal and the detection signal, and obtains likelihood information which is related to a bit having a probability of error which exceeds a predetermined value, based on the equalized signal. The control of the sampling positions is suppressed during a time which is based on the likelihood information.

14 Claims, 7 Drawing Sheets

TIMING RECOVERY METHOD AND STORAGE APPARATUS FOR SUPPRESSING CONTROL OF SAMPLING POSITIONS

BACKGROUND OF THE INVENTION

This application claims the benefit of a Japanese Patent Application No.2002-229393 filed Aug. 7, 2002, in the Japanese Patent Office, the disclosure of which is hereby incorporated by reference.

1. Field of the Invention

The present invention generally relates to timing recovery methods and storage apparatuses, and more particularly to a timing recovery method which is used when reproducing information from a recording medium such as a magnetic disk, an optical disk and a magneto-optical disk, and to a storage apparatus which employs such a timing recovery method.

2. Description of the Related Art

FIG. 1 is a system block diagram showing a structure of an important part of a magnetic storage apparatus which employs an example of a conventional timing recovery method, that is, a structure of a timing recovery section. The magnetic storage apparatus shown in FIG. 1 includes a gain controller 1, a voltage gain amplifier (VGA) 2, a continuous transfer function (CTF) analog filter 3, an analog-to-digital converter (ADC) 4, a finite impulse response (FIR) filter 5, a detector 6, an RLL decoder 7, a phase comparator 8, a loop filter 9, and a voltage controlled oscillator (VCO) 10.

A reproduced signal is output from a head 11 which reads a magnetic recording medium 12 such as a magnetic disk. This reproduced signal is passes through the VGA 2, which has a gain controlled by the gain controller 1, and the CTF analog filter 3, and is sampled by the ADC 4. Data of the sampled signal are equalized by the FIR filter 5, and compared in the phase comparator 8 with samples detected by the detector 6. A phase error signal is calculated by and output from the phase comparator 8. The phase error signal passes through the loop filter 9, and controls an oscillation frequency of the VCO 10. Hence, a feedback loop is formed in which the sampling positions of the ADC 4 are controlled. An output of the detector 6 is decoded by the RLL decoder 7 and supplied to a controller (not shown) within the magnetic storage apparatus.

Conventionally, the signal detected by the detector 6 is used as a target value when calculating the phase error signal in the phase comparator 8. For this reason, when an error exists in the output signal of the detector 6, an erroneous target value is used in the phase comparator 8, thereby causing the timing recovery section to respond to an erroneous phase error signal.

In a case where a signal-to-noise ratio (SNR) is good, the possibility that an error exists in the output signal of the detector 6 is low. But under low SNR conditions, the possibility that the error exists in the output signal of the detector 6 is high, thereby causing the timing recovery section to respond to the erroneous phase error signal and causing a problem in that a stable timing recovery cannot be carried out.

SUMMARY OF THE INVENTION

Accordingly, it is a general object of the present invention to provide a novel and useful timing recovery method and storage apparatus, in which the problem described above is eliminated.

Another and more specific object of the present invention is to provide a timing recovery method and a storage apparatus, which can suppress a timing recovery from following an erroneous detection data (target value) even under low SNR conditions where there is a high possibility that the detection data includes an error, and can always carry out a stable timing recovery.

Still another object of the present invention is to provide a timing recovery method comprising an equalizing step sampling and equalizing a signal reproduced from a recording medium; a detecting step detecting the equalized signal and outputting a detection signal; a phase comparing step comparing phases of the equalized signal and the detection signal and obtaining a phase error; a control step controlling sampling positions based on the phase error; and an error bit estimation step estimating generation of an error bit based on the equalized signal, where the phase comparing step is masked during a time in which the generation of the error bit is estimated, so as to suppress control of the sampling positions by the control step. According to the timing recovery method of the present invention, it is possible to suppress the timing recovery from following an erroneous detection data (target value) even under low SNR conditions where there is a high possibility that the detection data includes an error, and always carry out a stable timing recovery.

A further object of the present invention is to provide a timing recovery method comprising a detecting step sampling, equalizing and detecting a signal reproduced from a recording medium and outputting a detection signal; a control step controlling sampling positions based on a phase error between the equalized signal and the detection signal; and an information obtaining step obtaining likelihood information which is related to a bit having a probability of error which exceeds a predetermined value, based on the equalized signal, where the control of the sampling positions by the control step is suppressed during a time which is based on the likelihood information. According to the timing recovery method of the present invention, it is possible to suppress the timing recovery from following an erroneous detection data (target value) even under low SNR conditions where there is a high possibility that the detection data includes an error, and always carry out a stable timing recovery.

Another object of the present invention is to provide a storage apparatus comprising an equalizing part sampling and equalizing a signal reproduced from a recording medium; a detector detecting the equalized signal and outputting a detection signal; a phase comparator comparing phases of the equalized signal and the detection signal and obtaining a phase error; a control part controlling sampling positions based on the phase error; and an error bit estimation part estimating generation of an error bit based on the equalized signal, where the phase comparator is masked during a time in which the generation of the error bit is estimated, so as to suppress control of the sampling positions by the control part. According to the storage apparatus of the present invention, it is possible to suppress the timing recovery from following an erroneous detection data (target value) even under low SNR conditions where there is a high possibility that the detection data includes an error, and always carry out a stable timing recovery.

Still another object of the present invention is to provide a storage apparatus comprising a detecting section sampling, equalizing and detecting a signal reproduced from a recording medium and outputting a detection signal; a control section controlling sampling positions based on a phase error between the equalized signal and the detection signal; and a section obtaining likelihood information which is related to a bit having a probability of error which exceeds a predetermined value, based on the equalized signal, where the control of the sampling positions by the control section is suppressed during a time which is based on the likelihood information. According to the storage apparatus of the present invention, it is possible to suppress the timing recovery from following an erroneous detection data (target value) even under low SNR conditions where there is a high possibility that the detection data includes an error, and always carry out a stable timing recovery.

In other words, according to the present invention, it is possible to suppress the timing recovery from following the erroneous detection data (target value), by feeding back the bit information (likelihood information) which indicates the bit having a high possibility of error, for the phase comparison, together with the detection signal. For this reason, it is possible to carry out a stable timing recovery even under low SNR conditions where there is a high possibility that the detection data includes error.

Other objects and further features of the present invention will be apparent from the following detailed description when read in conjunction with the accompanying drawings.

DESCRIPTION OF THE PREFERRED EMBODIMENTS

In the present invention, an output of a detector and bit information which indicates a bit having a high possibility of becoming erroneous are fed back to a phase comparator, so that a timing recovery is held and prevented from following an erroneous data with respect to the bit having the high possibility of become erroneous.

A description will be given of various embodiments of a timing recovery method according to the present invention and a storage apparatus according to the present invention, by referring to FIG. 2 and the subsequent drawings.

Figure 1:
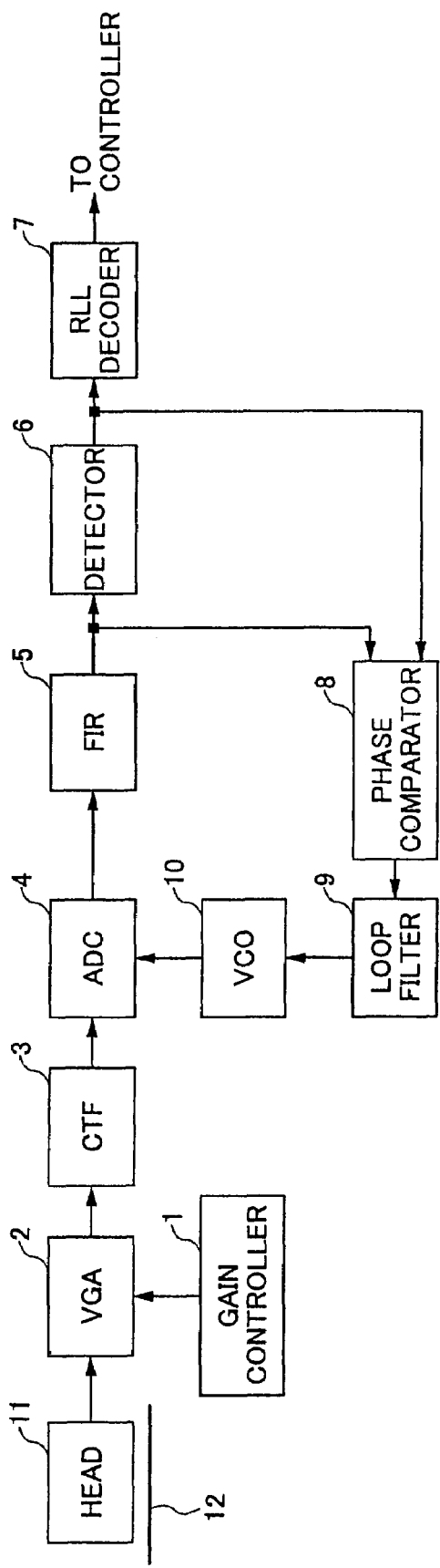
FIG. 1 is a system block diagram showing a structure of an important part of a magnetic storage apparatus employing an example of a conventional timing recovery method.
Figure 2:
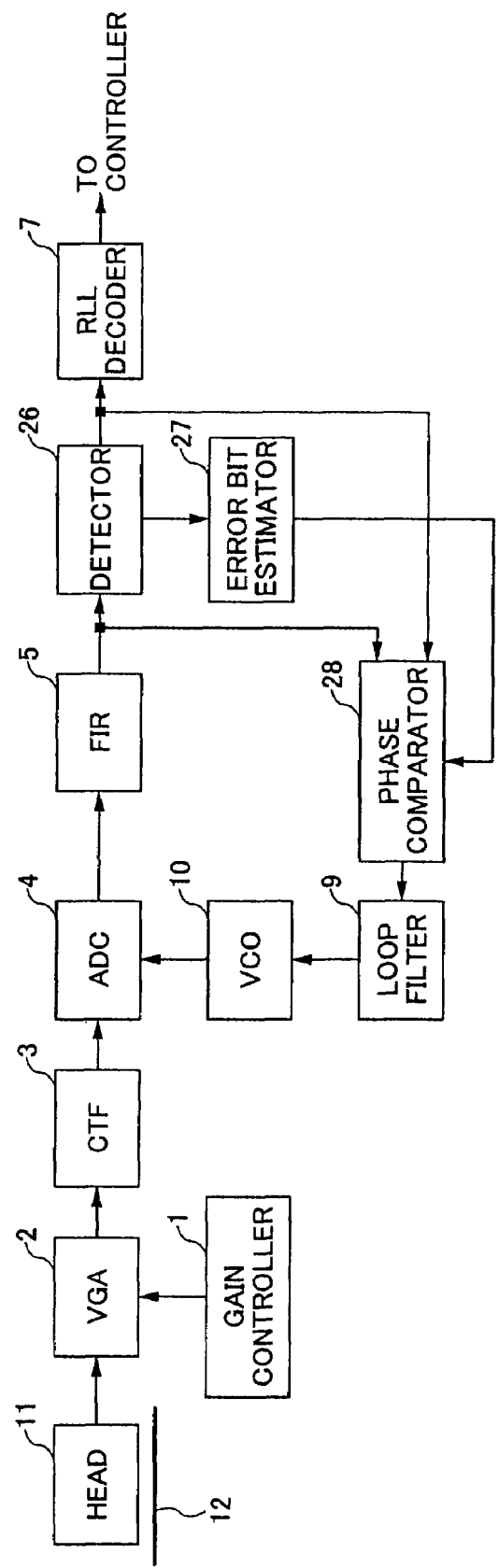
FIG. 2 is a system block diagram showing a structure of an important part of a first embodiment of a storage apparatus according to the present invention.

FIG. 2 is a system block diagram showing a structure of an important part of a first embodiment of the storage apparatus according to the present invention, that is, a structure of a timing recovery section. In FIG. 2, those parts which are the same as those corresponding parts in FIG. 1 are designated by the same reference numerals, and a description thereof will be omitted. This first embodiment of the storage apparatus employs a first embodiment of the timing recovery method according to the present invention.

In this first embodiment, the present invention is applied to a magnetic storage apparatus.

In this embodiment, a detector 26 and a phase comparator 28 shown in FIG. 2 are provided in place of the detector 6 and the phase comparator 8 shown in FIG. 1. In addition, an error bit estimator 27 shown in FIG. 2 is provided between the detector 26 and the phase comparator 28.

In other words, the phase comparator 28 is supplied with the equalized signal data from the FIR filter 5, the detection data (target value) output from the detector 26, and an error bit signal which is generated from the error bit estimator 27 based on information received from the detector 26. For example, the error bit signal is "0" when no error exists, and is "1" when an error exists. The phase comparator 28 carries out a normal operation and outputs the phase error signal for the bit having no error, but outputs a phase error signal which is "0" for the bit having the error. The phase error signal normally controls the oscillation frequency of the VCO 10 via the loop filter 9, but when the phase error signal is "0", no control is carried out with respect to the VCO 10 and the immediately preceding state is maintained.

Hence, according to this embodiment, it is possible to suppress the timing recovery from following the erroneous detection data (target value), by feeding back via the error bit estimator 27 the bit information (likelihood information) related to the bit having the high possibility of being in error with respect to the phase comparator 28 together with the output of the detector 26. As a result, it is possible to carry out a stable timing recovery even under low SNR conditions where the possibility that the detection data will include an error is greater than a predetermined value.

Figure 3:
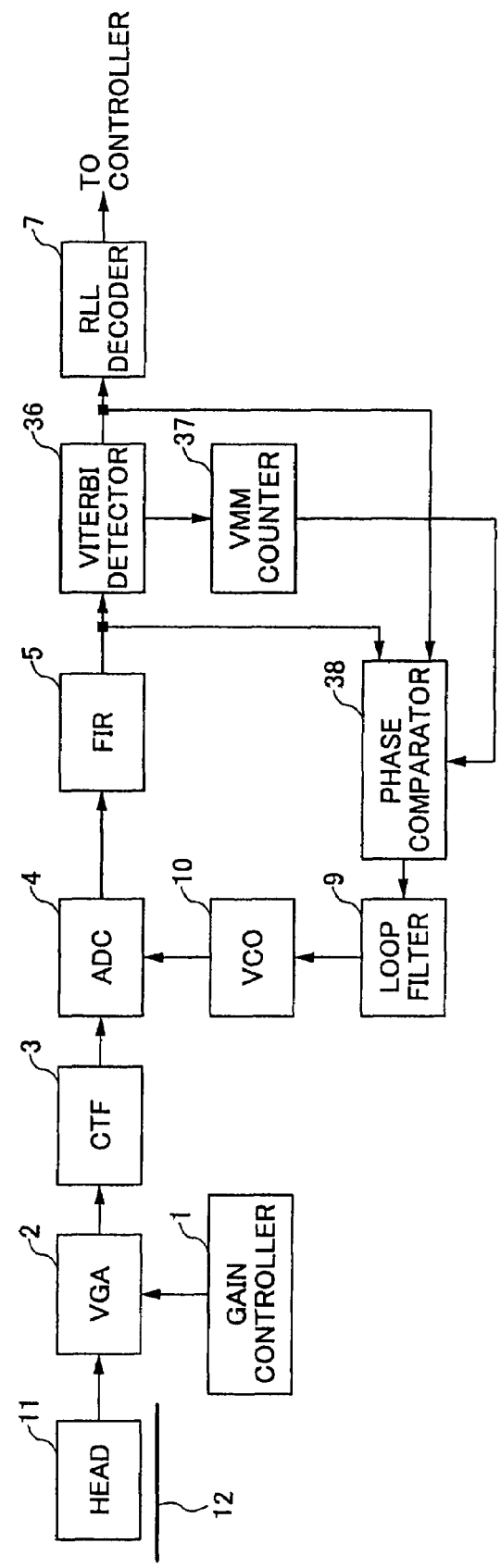
FIG. 3 is a system block diagram showing a structure of an important part of a second embodiment of the storage apparatus according to the present invention.

FIG. 3 is a system block diagram showing a structure of an important part of a second embodiment of the storage apparatus according to the present invention, that is, a structure of a timing recovery section. In FIG. 3, those parts which are the same as those corresponding parts in FIGS. 1 and 2 are designated by the same reference numerals, and a description thereof will be omitted. This second embodiment of the storage apparatus employs a second embodiment of the timing recovery method according to the present invention. In this second embodiment, the present invention is applied to a magnetic storage apparatus.

In this embodiment, a Viterbi detector 36 and a phase comparator 38 shown in FIG. 3 are provided in place of the detector 6 and the phase comparator 8 shown in FIG. 1. In addition, a Viterbi metric margin (VMM) counter 37 shown in FIG. 3 is provided between the Viterbi detector 36 and the phase comparator 38.

In other words, the phase comparator 38 is supplied with the equalized signal data from the FIR filter 5, the detection data (target value) output from the Viterbi detector 36, and an error bit signal which is generated from the VMM counter 37 based on information received from the Viterbi detector 36. For example, the error bit signal is "0" when no error exists, and is "1" when an error exists. The phase comparator 38 carries out a normal operation and outputs the phase error signal for the bit having no error, but outputs a phase error signal which is "0" for the bit having the error. The phase error signal normally controls the oscillation frequency of the VCO 10 via the loop filter 9, but when the phase error signal is "0", no control is carried out with respect to the VCO 10 and the immediately preceding state is maintained.

Hence, according to this embodiment, it is possible to suppress the timing recovery from following the erroneous detection data (target value), by feeding back via the VMM counter 37 the bit information (likelihood information) related to the bit having the high possibility of being in error with respect to the phase comparator 38 together with the output of the Viterbi detector 36. As a result, it is possible to carry out a stable timing recovery even under low SNR conditions where the possibility that the detection data will include an error is greater than a predetermined value.

Figure 4:
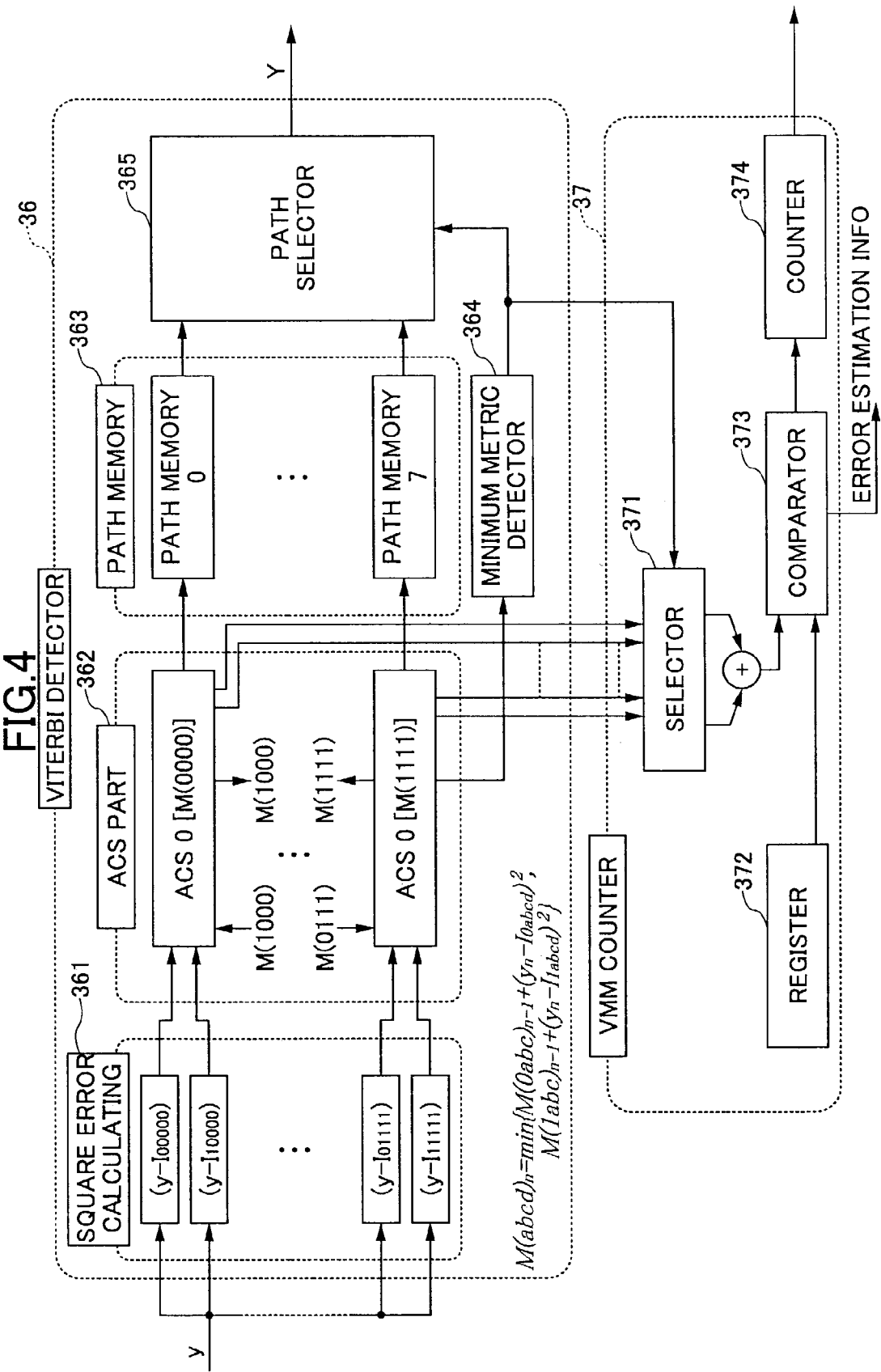
FIG. 4 is a system block diagram showing a structure of a Viterbi detector and a VMM counter.

FIG. 4 is a system block diagram showing a structure of the Viterbi detector 36 and the VMM counter 37. The structure itself of each of the Viterbi detector 36 and the VMM counter 37 is known, and only a brief description will be given of an operation of the Viterbi detector 36 and the VMM counter 37. The Viterbi detector 36 includes a square error calculating part 361, an add-compare-elect (ACS) part 362, a path memory part 363, a minimum metric detector 364, and a path selector 365. The VMM counter 37 includes a selector 371, a threshold register 372, a comparator 373, and a counter 374.

The square error calculating part 361 calculates a square error (branch metric) of an input signal (y) and an ideal value (Ixxxxx) of each node for each sample bit. In the case of an E2 partial response (PR) system, the square error calculating part 361 normally has a structure corresponding to 32 nodes. The ACS part 362 receives an output of the square error calculating part 361, and obtains a value by adding a metric (Mxxxx) up to one previous sample to the present branch metric. In addition, the ACS part 362 compares the obtained value and the output of the square error calculating part 361, and selects and holds a smaller one of the two. Hence, the ACS part 362 has a structure including ACSs corresponding to 16 states, that is, one-half that of the square error calculating part 361. The path memory part 363 stores a path thereto and corresponding to n samples, and is formed by the same number of path memories as the ACSs forming the ACS part 362. In order to select the path of the node having the minimum metric, the path selector 365 selects an optimum path based on minimum metric information selected by the minimum metric detector 364. The Viterbi detector 36 carries out the above described operation for every sample bit. The minimum metric detector 364 detects minimum metric information $M(abcd)_n$, for example, based on the following formula.

$$M(abcd)_n = \min\{M(0abc)_{n-1} + (y_n - I_{0abcd})^2, \ldots, M(1abc)_{n-1} + (y_n - I_{1abcd})^2\}$$

The metrics corresponding to the nodes of the square error calculating part 361 is output to the VMM counter 37 for each sample bit from the ACS part 362 of the Viterbi detector 36. A difference between the minimum metric detected by the minimum metric detector 364 and the metric of the node which is connected to the same ACS as the node having the minimum metric, is supplied to the selector 371 within the VMM counter 37. The comparator 373 compares this difference with a predetermined threshold which is set in the threshold register 372, and counts up a counted value of the counter 374 when the difference exceeds the predetermined threshold. When the difference is the predetermined threshold or less, it means that the probability of error is high for the result of the Viterbi detection. Normally, the counted value of the counter 374 is used for measuring a margin of a read channel (RDC, not shown) within the magnetic storage apparatus. In this embodiment, the counted value of the counter 374 is fed back to the phase comparator 28 as an error estimation bit.

Generally, the information indicating the probability that the bit will be in error is referred to as likelihood information, and the present invention is not limited to the Viterbi detection used in this embodiment, but is also similarly applicable to detectors which use such likelihood information.

The phase comparator 28 calculates a phase error signal Phase_Err from the output (y) of the FIR filter 5 and the output (Y) of the Viterbi detector 6, based on the following formula, where T denotes a coefficient table for obtaining a phase (time) error from the level error (y—Y).

$$\text{Phase\_Err} = T^*(y - Y)$$

Figure 5:
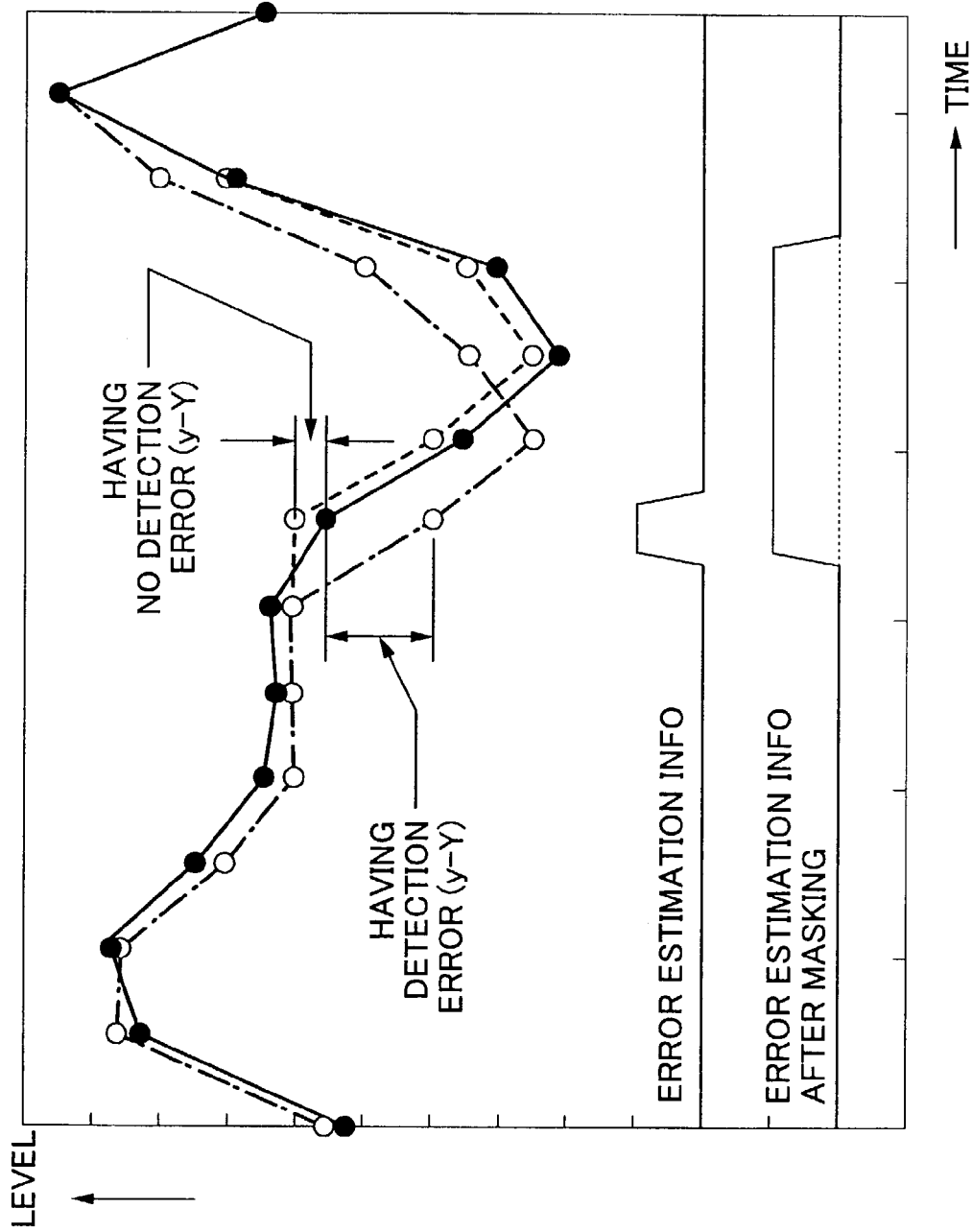
FIG. 5 is a diagram for explaining an operation of a phase comparator.

FIG. 5 is a diagram for explaining the operation of the phase comparator 28. FIG. 5 generally shows the concept of the phase detection method used in the present invention. In FIG. 5, a dotted line indicates a case where no error exists in the output of the Viterbi detector 36, a one-dot chain line indicates a case where an error exists in the output of the Viterbi detector 36, and a solid line indicates the input signal. As shown in FIG. 5, the error (y-Y) takes a large value when the error exists in the output of the Viterbi detector 36, and in this case, the timing recovery section follows the erroneous detection data (target value).

The power portion of FIG. 5 shows the error estimation information output from the VMM counter 37, and masked error estimation information which will be described later. The masked error estimation information is obtained by masking the error estimation information by a mask adjuster 272 within the phase comparator 28 shown in FIG. 6 which will be described later.

Figure 6:
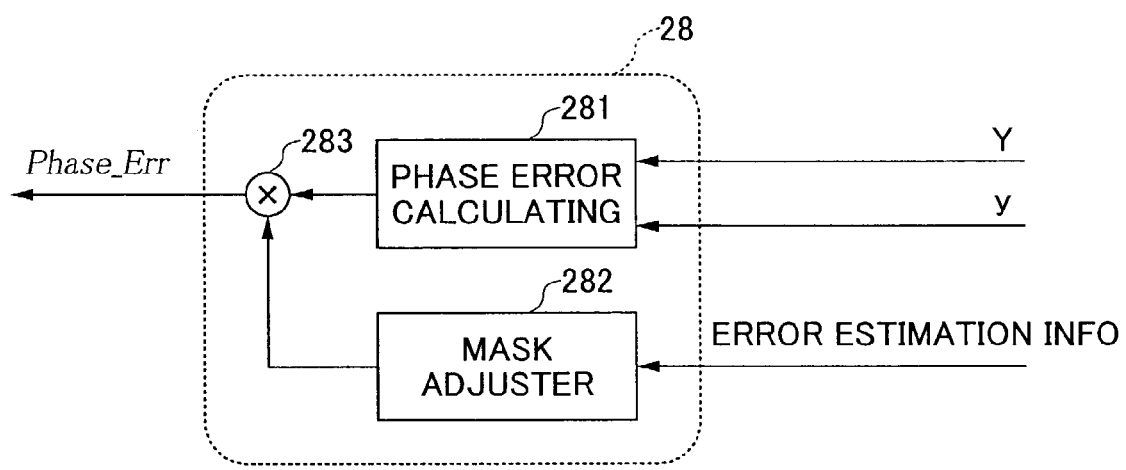
FIG. 6 is a system block diagram showing an embodiment of the phase comparator.

This embodiment uses the phase comparator 28 having a structure shown in FIG. 6, so as to set the phase error signal to "0" by the error estimation information with respect to the sample bit having a high possibility of having an error. FIG. 6 is a system block diagram showing an embodiment of the phase comparator 28. Hence, it is possible to prevent the timing recovery section from following an erroneous detection data (target value). The phase comparator 28 shown in FIG. 6 includes a phase error calculating part 281, the mask adjuster 282 and a multiplier 283.

The error estimation information can specify the sample bit having a high probability of error. But actually, the error (y—Y) may become large for several bits subsequent to the specified sample bit having the high probability of error. Hence, in this embodiment, the mask adjuster 282 is provided as shown in FIG. 6, so as to provide a masking function to make the phase error signal "0" with respect to the several bits subsequent to the specified sample bit having the high probability of error. The actual operation is as shown in FIG. 5.

Figure 7:
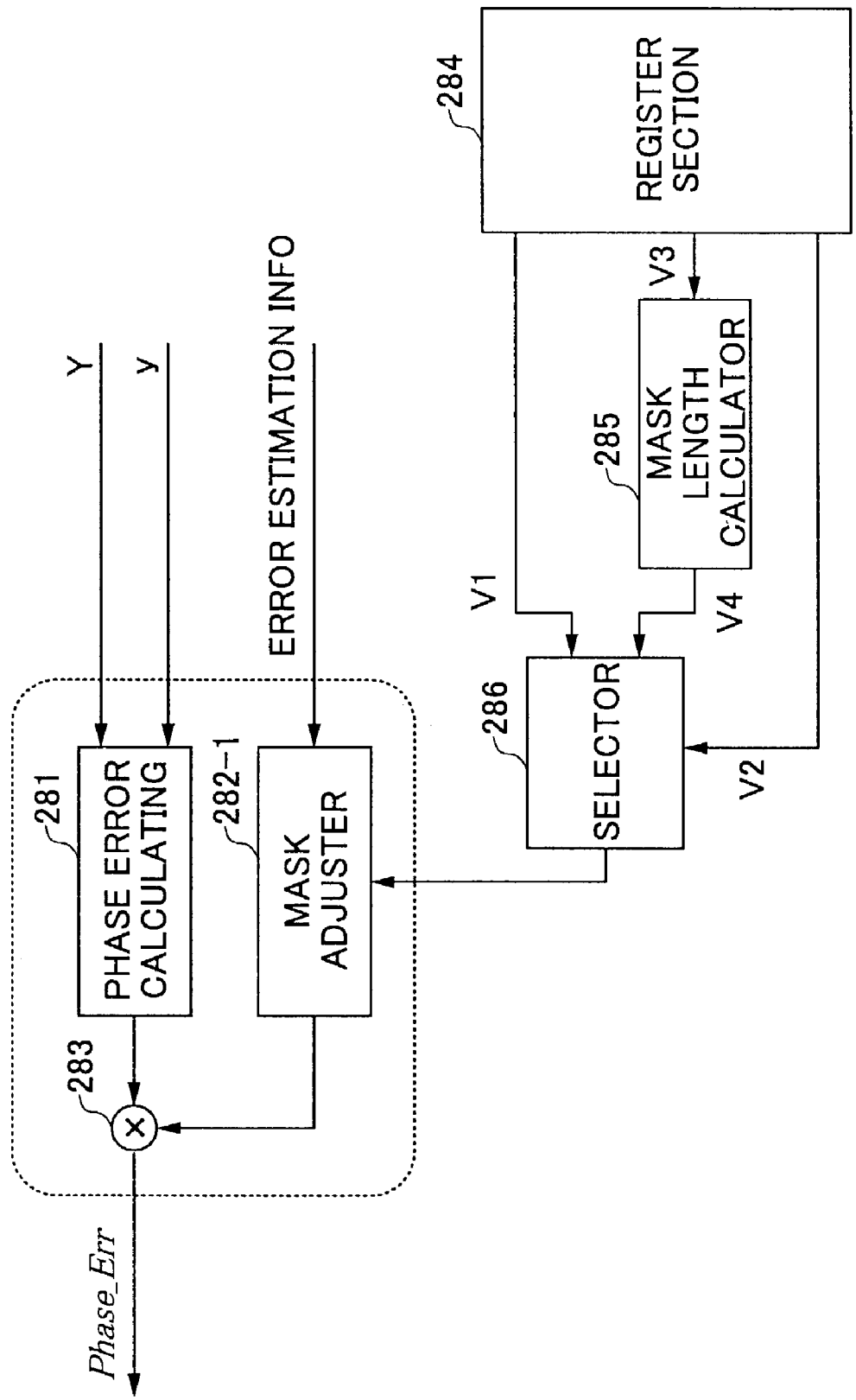
FIG. 7 is a system block diagram showing another embodiment of the phase comparator.

FIG. 7 is a system block diagram showing another embodiment of the phase comparator 28. In FIG. 7, those parts which are the same as those corresponding parts in FIG. 6 are designated by the same reference numerals, and a description thereof will be omitted. In this embodiment, a control circuit which includes a register section 284, a mask length calculator 285 and a selector 286 is provided with respect to a mask adjuster 282-1. A portion of the control circuit or, all of the control circuit may be provided within the phase comparator 28 or provided externally to the phase comparator 28. If the register section 284 of the control circuit is provided externally to the phase comparator 28, for example, the register section 284 may store parameters and the like which are supplied to the Viterbi detector 36 and the RLL decoder 7, and in this case, it is possible to simplify the structure of the magnetic storage apparatus by sharing hardware.

The register section 284 stores a value V1 indicating a prescribed mask length, a target value V2 of the partial response (PR), and a value V3 indicating which one of the values V1 and V2 is to be selected and input to the mask adjuster 282-1. The mask length calculator 285 calculates a value V4 of the mask length, based on the target value V3 of the PR stored in the register section 284, and supplies the value V4 to the selector 286. The mask length calculator 285 calculates the value V4 of the mask length, so that the bit length to be masked when the Viterbi detector 36 has an error of 1 bit becomes equal to a constraint length of the target value V3 of the PR. The values V1 and V2 stored in the register section 284 are also supplied to the selector 286. Accordingly, the selector 286 selectively outputs the value V1 from the register section 284 or the value V4 from the mask length calculator 285, depending on the value V2 from the register section 284, and supplies the output to the mask adjuster 282-1 within the phase comparator 28. As a result, the mask adjuster 282-1 sets the phase error signal to "0" with respect to the several bits subsequent to the specified sample bit having the high probability of error, only for the mask length indicated by the value V1 or V4 which is output from the selector 286.

In addition to automatically calculating the mask length from the target value of the PR, it is possible to obtain the mask length from training. In this case, the value V1 indicating the prescribed mask length and stored in the register section 284 is varied within an arbitrary range from the outside, and a training interval is provided to measure an error rate by carrying out an information read/write operation every time the value V1 is varied. By carrying out such a training, it is possible to obtain and select the mask length which minimizes the error rate.

In each of the embodiments described heretofore, the present invention is applied to the magnetic storage apparatus. However, the present invention is of course similarly applicable to other storage apparatuses such as an optical storage apparatus and a magneto-optical storage apparatus. In addition, the recording medium used by the storage apparatus is not limited to a disk-shaped recording medium, and the recording medium may have an arbitrary shape such as a card-shaped or other shapes suitable for information recording and reproduction.

Further, the present invention is not limited to these embodiments, but various variations and modifications may be made without departing from the scope of the present invention.

What is claimed is:

1. A timing recovery method comprising:
   an equalizing step sampling and equalizing a signal reproduced from a recording medium;
   a detecting step detecting the equalized signal and outputting a detection signal;
   a phase comparing step comparing phases of the equalized signal and the detection signal and obtaining a phase error;
   a control step controlling sampling positions based on the phase error; and
   an error bit estimation step estimating generation of an error bit based on the equalized signal,
   said phase comparing step being masked during a time in which the generation of the error bit is estimated based on an estimation of said error bit estimation step, so as to suppress control of the sampling positions by said control step based on the phase error obtained by said phase comparing step.

2. The timing recovery method as claimed in claim 1, wherein the control of the sampling positions by said control step during said time is maintained to a control immediately prior to suppression.

3. The timing recovery method as claimed in claim 2, wherein said time corresponds to a plurality of bits subsequent to the estimated error bit.

4. The timing recovery method as claimed in claim 1, wherein said detecting step detects the equalized signal by Viterbi detection.

5. The timing recovery method as claimed in claim 1, wherein said error bit estimation step obtains likelihood information which is related to a bit having a high probability of error and is obtained by a Viterbi metric margin counter.

6. A timing recovery method comprising:
   a detecting step sampling, equalizing and detecting a signal reproduced from a recording medium and outputting a detection signal;
   a control step controlling sampling positions based on a phase error between the equalized signal and the detection signal; and
   an information obtaining step obtaining likelihood information which is related to a bit having a probability of error which exceeds a predetermined value, based on the equalized signal,
   the control of the sampling positions by said control step being suppressed during a time which is determined by the likelihood information that is obtained by said information obtaining step.

7. A storage apparatus comprising:
   an equalizing part sampling and equalizing a signal reproduced from a recording medium;
   a detector detecting the equalized signal and outputting a detection signal;
   a phase comparator comparing phases of the equalized signal and the detection signal and obtaining a phase error;
   a control part controlling sampling positions based on the phase error; and
   an error bit estimation part estimating generation of an error bit based on the equalized signal,
   said phase comparator being masked during a time in which the generation of the error bit is estimated based on an estimation of said error bit estimation part, so as to suppress control of the sampling positions by said control part based on the phase error obtained by said phase comparator.

8. The storage apparatus as claimed in claim 7, wherein the control of the sampling positions by said control part during said time is maintained to a control immediately prior to suppression.

9. The storage apparatus as claimed in claim 8, wherein said time corresponds to a plurality of bits subsequent to the estimated error bit.

10. The storage apparatus as claimed in claim 7, wherein said detector includes a Viterbi detector which detects the equalized signal.

11. The storage apparatus as claimed in claim 7, wherein said error bit estimation part includes a Viterbi metric margin counter and obtains likelihood information which is related to a bit having a high probability of error and is obtained by the Viterbi metric margin counter.

12. The storage apparatus as claimed in claim 7, wherein said error bit estimation part estimates the generation of the error bit based on information derived from the equalized signal within said detector.

13. A storage apparatus comprising:
a detecting section sampling, equalizing and detecting a signal reproduced from a recording medium and outputting a detection signal;
a control section controlling sampling positions based on a phase error between the equalized signal and the detection signal; and
an information obtaining section obtaining likelihood information which is related to a bit having a probability of error which exceeds a predetermined value, based on the equalized signal,
the control of the sampling positions by said control section being suppressed during a time which is determined by the likelihood information that is obtained by said information obtaining section.

14. The storage apparatus as claimed in claim 13, wherein said likelihood information obtaining section obtains the likelihood information based on a target value derived from the equalized signal within said detecting section.

* * * * *